US008378285B2

(12) United States Patent
Inoue

(10) Patent No.: US 8,378,285 B2
(45) Date of Patent: Feb. 19, 2013

(54) PHOTOELECTRIC CONVERSION APPARATUS

(75) Inventor: Daisuke Inoue, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 12/695,607

(22) Filed: Jan. 28, 2010

(65) Prior Publication Data

US 2010/0219329 A1 Sep. 2, 2010

(30) Foreign Application Priority Data

Feb. 27, 2009 (JP) ................... 2009-046608

(51) Int. Cl.
*H01L 27/00* (2006.01)
*H01L 31/00* (2006.01)
*H04N 5/217* (2011.01)
(52) U.S. Cl. .................. 250/208.1; 250/214.1; 348/241
(58) Field of Classification Search ............. 250/208.1, 250/214 R, 214.1, 214 LS, 214 SW; 348/315–317, 348/344–350, 241, 243, 245
See application file for complete search history.

(56) References Cited

U.S. PATENT DOCUMENTS

| 4,523,829 A * | 6/1985 | Eguchi et al. ........... 396/123 |
|---|---|---|
| 4,736,251 A * | 4/1988 | Sasaoka ................. 358/505 |
| 5,861,620 A | 1/1999 | Takahashi et al. ....... 250/208.1 |
| 6,704,051 B1 | 3/2004 | Takahashi ............... 348/315 |
| 7,577,349 B2 | 8/2009 | Inoue et al. ............. 396/111 |
| 7,643,743 B2 | 1/2010 | Inoue et al. |
| 8,026,961 B2 * | 9/2011 | Takenaka et al. ......... 348/241 |
| 2007/0047939 A1 | 3/2007 | Inoue et al. ............. 396/102 |

FOREIGN PATENT DOCUMENTS

| EP | 0785673 A2 | 7/1997 |
|---|---|---|
| EP | 0926527 A2 | 6/1999 |
| JP | 09-200614 | 7/1997 |
| JP | 09-200629 | 7/1997 |
| JP | 11-191867 | 7/1999 |
| JP | 2002-214516 | 7/2002 |
| JP | 2007-065324 | 3/2007 |

\* cited by examiner

*Primary Examiner* — Georgia Y Epps
*Assistant Examiner* — Don Williams
(74) *Attorney, Agent, or Firm* — Fitzpatrick, Cella, Harper & Scinto

(57) ABSTRACT

Provided is a photoelectric conversion apparatus for detecting focus, which provides an increased number of ranging points while suppressing a chip-area increase. In a first mode, signals from a first line sensor L1 group are written in a first line memory L1 group while signals from a second line sensor L2 group are written in a second line memory L2 group. In a second mode, signals from the second line sensor L2 group are written in the first line memory L1 group while signals from the first line sensor L1 group are written in the second line memory L2 group, so that even one and the same line sensor can select different ranging point regions, enabling provision of an increased number of ranging points while suppressing a chip-area increase.

8 Claims, 7 Drawing Sheets

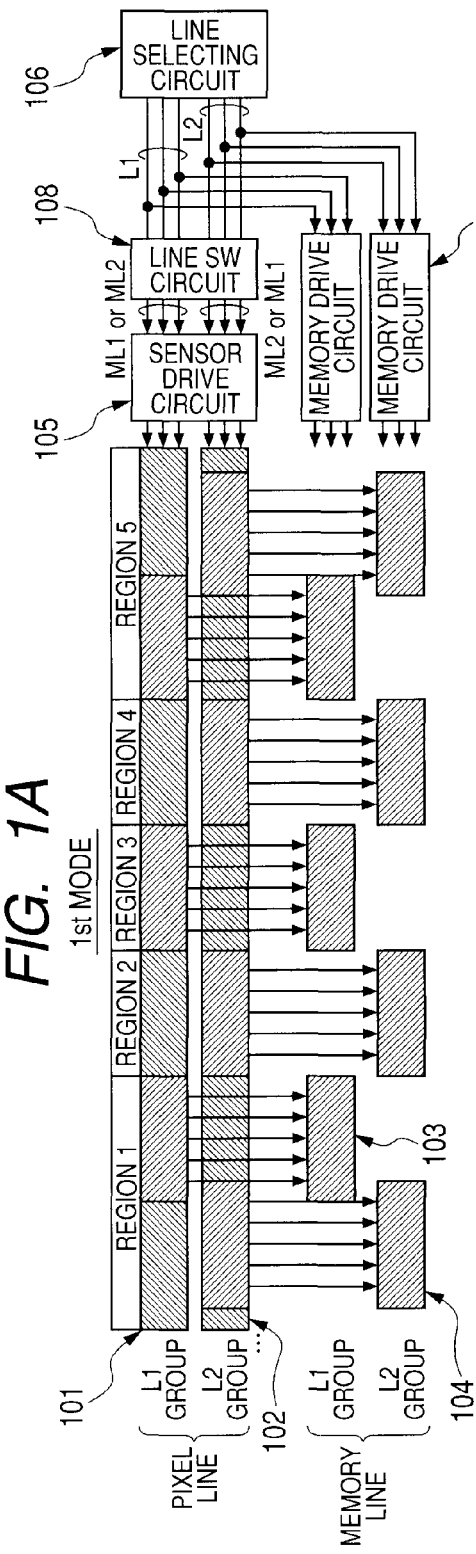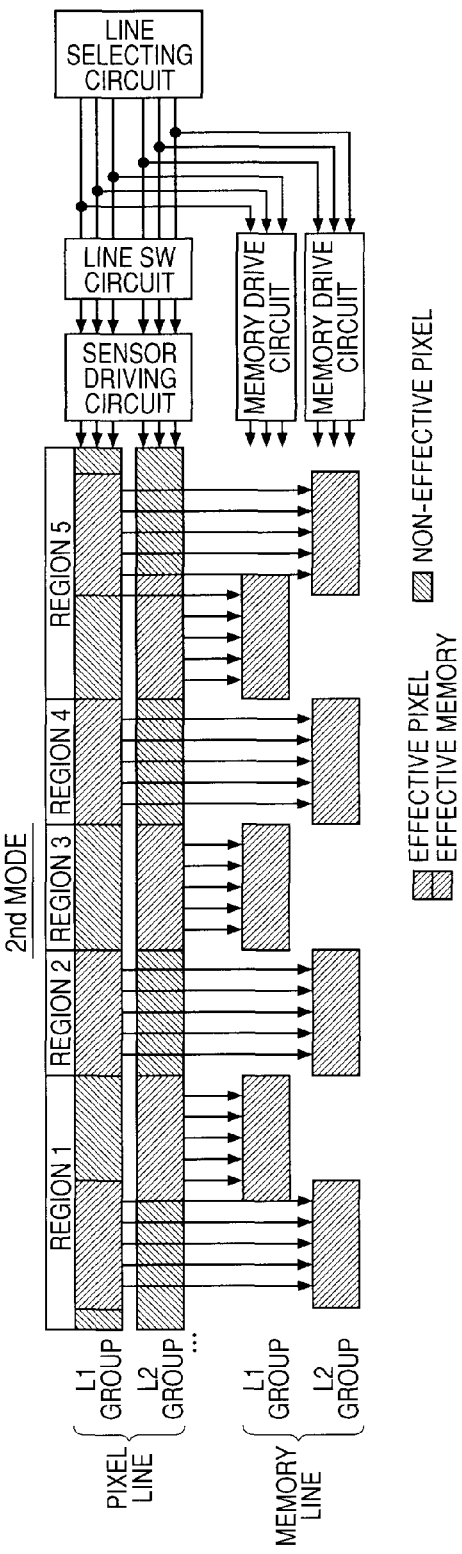

108

PHOTOELECTRIC CONVERSION APPARATUS

BACKGROUND OF THE INVENTION

1. Field of the Invention

The present invention relates to a photoelectric conversion apparatus for detecting focus, which performs phase difference detection auto-focusing.

2. Description of the Related Art

Conventionally, for photoelectric conversion apparatuses for auto-focusing (AF) (auto-focus (AF) sensors), it has been proposed to switch effective regions in a sensor depending on the light-projection unit of the light source for ranging according to the scene to be shot, as indicated in Japanese Patent Application Laid-Open No. 2002-214516. Japanese Patent Application Laid-Open No. 2002-214516 describes that, for example, in a first ranging mode, focusing is performed by ranging one ranging point when light is emitted, and in a second ranging mode, focusing is performed by ranging seven ranging points when no light is emitted. In the art, various types of AF modes are employed to deal with scenes for which ranging is difficult to perform, and the effective regions in the sensor array can properly be switched, and thus, a correct ranging result can always be obtained, suppressing occurrence of a miss-focusing shooting result.

Also, in recent years, there has been an increasing demand for providing an increased number of auto-focus ranging points, an area-type phase difference detection AF sensor, which is regarded as being advantageous for providing an increased number of ranging points is disclosed in Japanese Patent Application Laid-Open No. 2007-65324. Conventional area-type AF sensors, as disclosed in Japanese Patent Application Laid-Open Nos. H09-200614 and H09-200629, image signals from effective sensor elements are transferred to and retained in frame memories connected one by one to the sensor elements. Furthermore, according to Japanese Patent Application Laid-Open No. H11-191867, when adjacent ranging regions are projected on the surface of the sensor, the regions partially overlap in the column direction owing to the effect of the optical system of the AF unit.

While the abovementioned area-type phase difference detection AF sensor is used for high-speed and high-precision auto-focusing of multiple ranging points in a wide area, it has a problem in a cost increase caused by a chip-area increase.

SUMMARY OF THE INVENTION

The present invention has been made in view of the above-mentioned circumstances, and an object of the present invention is to provide a photoelectric conversion apparatus for detecting focus, which provides an increased number of ranging points while suppressing a chip-area increase.

According to one aspect of the present invention, a photoelectric conversion apparatus comprises: a plurality of line sensors each arranged along each one of a plurality of rows, wherein the line sensor comprises a plurality of sensor elements, and controlled such that, in a first mode, some of the sensor elements, arranged correspondingly to a ranging point region for detecting focus in said first mode, are set as effective, while the others of the sensor elements, arranged outside of the region corresponding to the ranging point region for focusing in said first mode, are set as non-effective and, in a second mode, the others of the sensor elements are set as effective, while the some of the sensor elements are set as non-effective, and a part of sensor elements of the plurality of line sensors is set as effective portions in both of the first and second mode.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 1A and 1B are diagrams illustrating block segmentation in an area-type AF sensor according to a first embodiment of the present invention.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

One possible method for achieving the above object is that: the number of ranging points is increased by changing ranging region segmentation points in one line to utilize sensor elements (hereinafter, referred to as "pixels" for descriptive purposes), which have been non-effective portions, as effective portions. However, where frame memories correspond one by one to predetermined sensor elements, which are effective portions, signals from the sensor elements, which have been non-effective portions, cannot be retained. Supposing that an attempt is made to retain the signals, it is necessary to provide extra frame memories for the overlapped sensor elements, increasing the chip area. Furthermore, the size of the selection circuit is increased for selecting the regions corresponding to the extra frame memories, and the number of wirings that control and drive the frame memories also increases, resulting in a further increase in the chip area, which is not practical.

A problem in an area-type AF sensor according to a comparative example will be described with reference to FIGS. 5 to 8.

Figure 5:
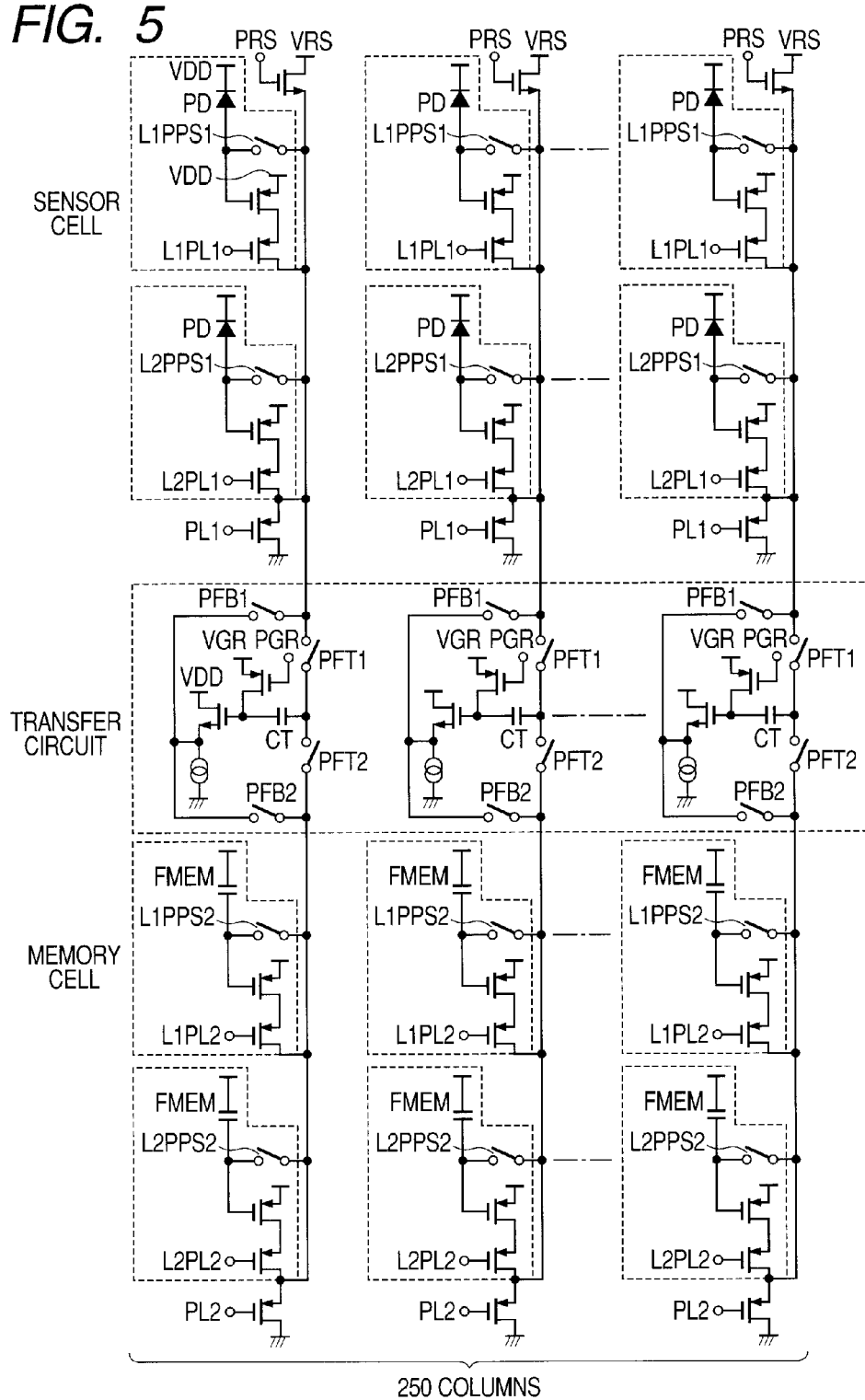
FIG. 5 is a diagram illustrating an example configuration of an area-type AF sensor.

FIG. 5 is a diagram illustrating an example configuration of an area-type AF sensor. In FIG. 5, two sensor groups (hereinafter, "line sensors") are extracted and illustrated as an example. The area-type AF sensor illustrated in FIG. 5 includes 250 structures (250 columns) each including a transfer circuit, and sensor cells and memory cells connected via the transfer circuit, arranged in an array in the row direction.

Each sensor cell includes a photo diode PD and an MOS transistor. A sensor element may include at least a photo diode, or a sensor element may also be configured by including a sensor cell in its entirety.

In the sensor cells, signals are read out by means of inversion amplifiers operating in response to read pulses L1PL1, L2PL1 and PL1, and noises are written in parasitic capacitances of their respective photo diodes PD via switches operating in response to write pulses L1PPS1 and L2PPS1. A read pulse LiPL1 (i is a natural number) for the sensors in each line is output as a result of an AND operation between the read pulse PL1 and a line selection pulse L1.

A vertical output line is provided with a MOS switch operating according to a signal PRS for performing a reset to a reset level VRS.

Each transfer circuit includes a MOS switch operating according to a signal PGR for clamping to a constant voltage VGR, a transfer capacitance CT, and an NMOS source follower circuit. In the transfer circuit, as described in Japanese Patent Application Laid-Open No. H09-200629, control is performed to arbitrarily turn on/off respective switches according to signals PFT1, PFB1, PFT2 and PFB2, performing noise removal and signal transfer.

Each memory cell includes a frame memory FMEM and a MOS transistor. In the memory cells, signals are read out by means of inversion amplifiers operating in response to read pulses L1PL2, L2PL2 and PL2, and the signals are written in the frame memories FMEM via switches operating in response to write pulses L1PPS2 and L2PPS2. A read pulse L1PL2 (i is a natural number) for memories in each line is output as a result of an AND operation between the read pulse PL2 and a line selection pulse L1.

Figure 6:
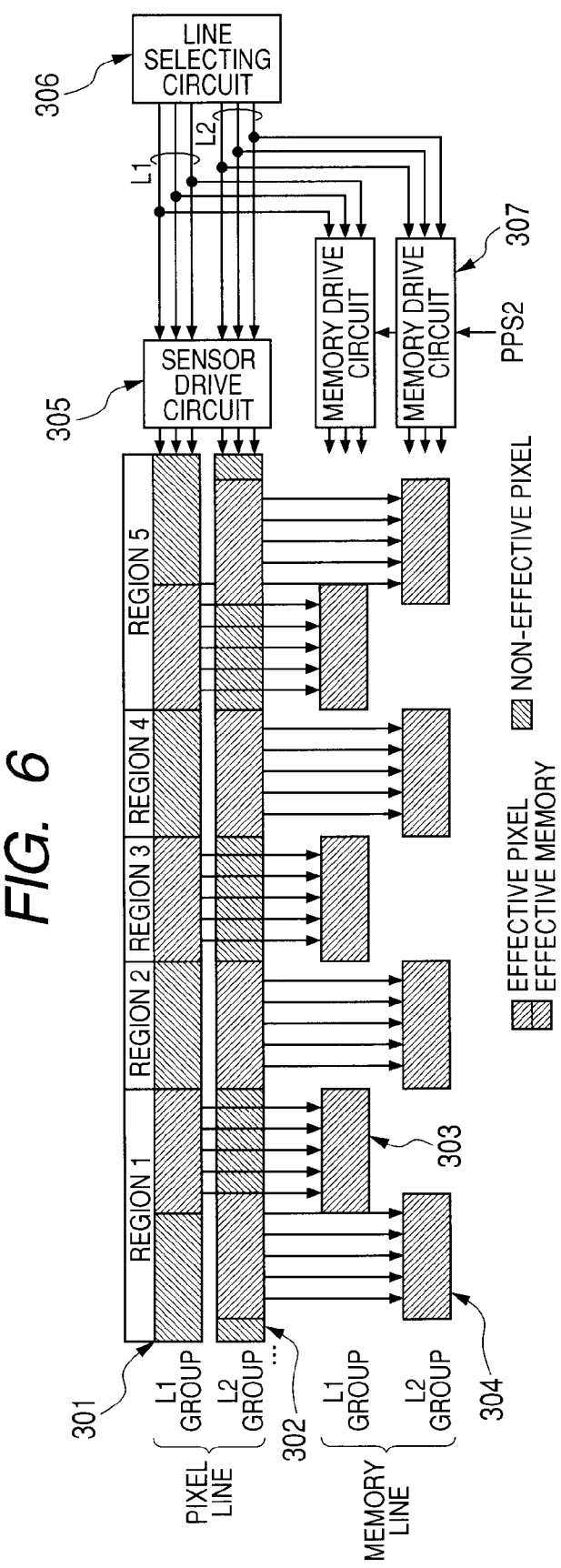
FIG. 6 is a diagram schematically illustrating block segmentation in the area-type AF sensor illustrated in FIG. 5.

FIG. 6 is a diagram schematically illustrating block segmentation in the area-type AF sensor illustrated in FIG. 5.

In FIG. 6, line sensors arranged in the row direction are segmented into five different ranging point regions for the respective lines. Each segmented region corresponds to a ranging point in a finder. For example, for a line sensor L1 group 301, regions 1, 3 and 5 are designated corresponding to ranging points in the finder, and for a line sensor L2 group 302, regions 1, 2, 4 and 5 are designated corresponding to ranging points in the finder. The regions not designated are non-effective portions. Even the region 1 has an effective portion displacement between adjacent line sensor groups owing to the effect of the optical system of the AF unit. Furthermore, the sensors are arranged in line with the optical system of the AF unit, and thus, some of the ranging point regions in adjacent line sensors partially overlap in the row direction.

For the sensor elements which are effective portions, a necessity minimum number of frame memories are provided corresponding one by one to the sensor elements. Each of the sensor elements which are non-effective portions is not used for a sensor element for an arithmetic operation in an AGC (automatic gain control) region for automatically controlling a gain of a signal output circuit according to the accumulation time.

In other words, while the line sensor L1 group 301 being selected, the frame memories in a line memory L1 group 303 corresponding one by one to the sensor elements, which are effective portions of the line sensor L1 group 301, are driven. In the same way, while the line sensor L2 group 302 being selected, the frame memories in a line memory L2 group 304 corresponding one by one to the sensor element, which are effective portions of the line sensor L2 group 302 are driven. Accordingly, the number of frame memories driven differs depending on the line.

Figure 7:
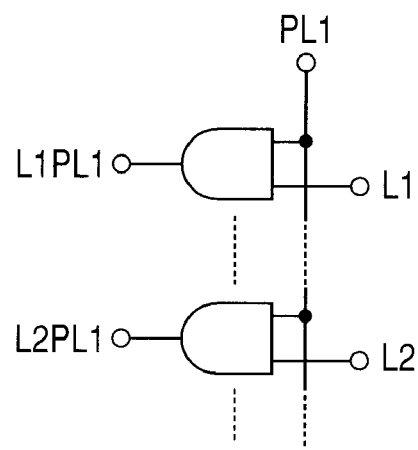
FIG. 7 is a circuit diagram illustrating a configuration of a conventional sensor drive circuit.

A sensor drive circuit 305 is provided to drive sensors, and memory drive circuits 307 are provided to drive memories. The sensor drive circuit 305 is configured, for example, as illustrated in FIG. 7. In other words, the sensor drive circuit 305 performs an AND operation between line selection pulses L1, L2 . . . , which have been decoded from serial communication in a line selecting circuit 306, and the read pulse PL1 for the sensors. The sensor drive circuit 305 outputs the arithmetic operation result as read pulses L1PL1, L1PL2 . . . for sensors in the respective lines. For example, where the line selection pulse L1 =1 (Hi), the sensor drive circuit 305 outputs the read pulse L1PL1 to drive the line sensor L1 group 301, while where the line selection pulse L2 =1, the sensor drive circuit 305 outputs the read pulse L2PL1 to drive the line sensor L2 group 302. A memory drive circuit 307 has a configuration similar to the sensor drive circuit 305.

Figure 8:
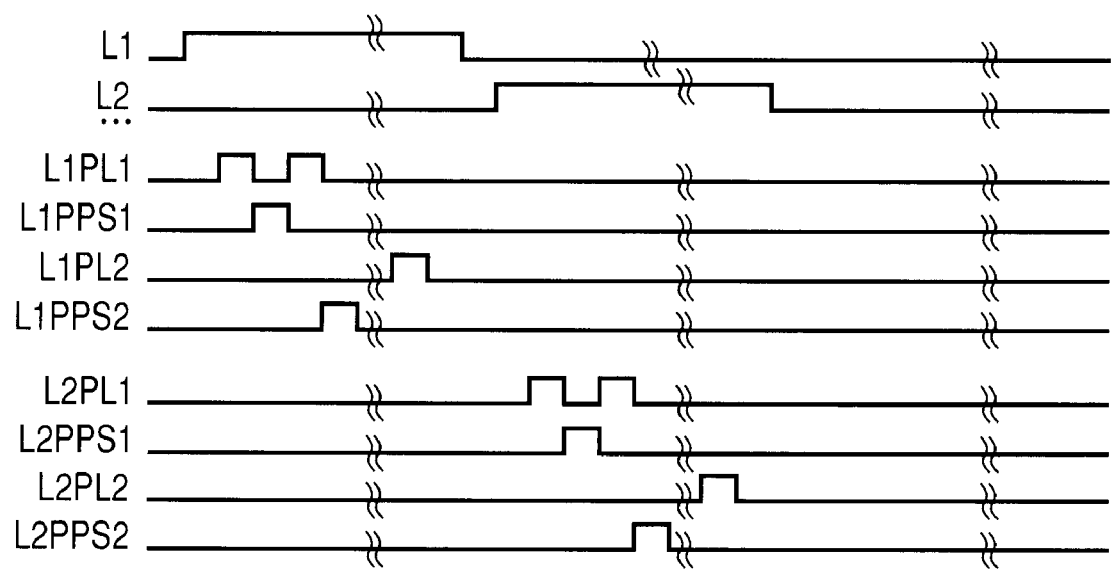
FIG. 8 is a diagram illustrating an example of drive pulses for a conventional area-type AF sensor.

FIG. 8 is a diagram illustrating an example of drive pulses for an area-type AF sensor according to a reference example.

Use of a drive circuit such as illustrated in FIG. 7 enables provision of a drive pulse only to a selected line. While the line sensor L1 group is being selected (i.e., the line selection pulse L1 =1), signals are read out in response to the read pulse L1PL1 for the sensors in the line sensor L1 group 301, and noises are written in response to a write pulse L1PPS1 for the sensors in the line sensor L1 group 301. Also, the signals are read out in response to the read pulse L1PL2 for the memories in the line memory L1 group 303, and the signals are written in the frame memories corresponding one by one to the sensors in response to a write pulse L1PPS2 for the memories in the line memory L1 group 303. In the same way, while the line sensor L2 group being selected (i.e., line selection pulse L2 =1), read and write sequences are provided respectively to the sensors in the line sensor L2 group 302 and the memories in the line memory L2 group 304 corresponding one by one to the sensors.

In the above-described configuration, the line sensors and the line memories correspond one by one to each other, and thus, when the segmented blocks of the effective pixels in a line sensor is changed to turn a sensor cell which is a non-effective portion into an effective portion, it is clear that a signal cannot be written in a frame memory.

Hereinafter, embodiments of the present invention will be described with reference to the drawings.

First Embodiment

FIGS. 1A and 1B are a diagram illustrating block segmentation in an area-type AF sensor employing a photoelectric conversion apparatus according to a first embodiment of the present invention. The photoelectric conversion apparatus may comprise an area-type AF sensor as shown in FIG. 5 and a line selection switching circuit shown in FIG. 2, as an example.

FIG. 1A is a schematic diagram for describing a first mode in the first embodiment, and FIG. 1B is a schematic diagram for describing a second mode in the first embodiment.

The area-type AF sensor illustrated in FIGS. 1A and 1B includes a first line sensor L1 group 101, a second line sensor L2 group 102, a first line memory L1 group 103 and a second line memory L2 group 104. The area-type AF sensor also includes a sensor drive circuit 105, a line selecting circuit 106, memory drive circuits 107 and a line selection switching circuit 108. A control circuit is formed by the sensor drive circuit 105, the line selecting circuit 106, the memory drive circuits 107 and the line selection switching circuit 108. The components 101 to 108 illustrated in FIGS. 1A and 1B are formed on one and the same semiconductor substrate by means of, e.g., CMOS process.

Although in the first line sensor L1 group 101 and the second line sensor L2 group 102, plural rows of line sensors aligned in the row direction (three line sensors in the example illustrated in FIGS. 1A and 1B) are regarded as one line sensor group, one line sensor may be substituted for the line sensor group. The first line sensor L1 group 101 and the second line sensor L2 group 102 are segmented into five regions where effective pixel regions are provided according to the ranging points. In other words, each line sensor group is divided into five segments according to ranging point regions for detecting focus, the sensor elements in the areas corresponding to the ranging point regions function as effective portions, and the sensor elements in the areas other than those areas function as non-effective portions.

The ranging point regions in the first line sensor L1 group 101 and the ranging point regions in the second line sensor L2 group 102 are arrayed in a zig-zag pattern. In other words, the ranging point regions in the first line sensor L1 group 101 and the ranging point regions in the second line sensor L2 group 102 are set so that they are staggered. Although in the present embodiment, some of the ranging point regions partially overlap in the row direction owing to the effect of the optical system of the AF unit, there may be ranging point regions not overlapping. The configuration of each line sensor group is the same as that described with reference to FIG. 5.

Effective frame memories in the first line memory L1 group 103 are arranged corresponding one by one to the sensor elements in the ranging point regions set for a first array in the first line sensor L1 group 101 in the first mode. Effective frame memories in the second line memory L2 group 104 are arranged corresponding one by one to the sensor elements in the ranging point regions set for a second array in the second line sensor L2 group 102 in the first mode. In FIGS. 1A and 1B, the arrows from the line sensors to the line memories schematically indicate vertical output lines, and signals are output via transfer circuits (not illustrated).

The sensor drive circuit 105 is a drive circuit that outputs pulses to drive the sensors, and the memory drive circuits 107 are drive circuits for driving the memories. The sensor drive circuit 105 and the memory drive circuits 107 correspond to the sensor drive circuit 305 and the memory drive circuits 307 illustrated in FIG. 6. The line selecting circuit 106 decodes an externally-provided line selection signal to output a line selection pulse. The line selection switching circuit 108 switches selected lines (i.e., switches selected ranging point regions) according to an externally-provided mode signal. The line selection switching circuit 108 is arranged between the line selecting circuit 106 and the sensor drive circuit 105.

Figure 2:
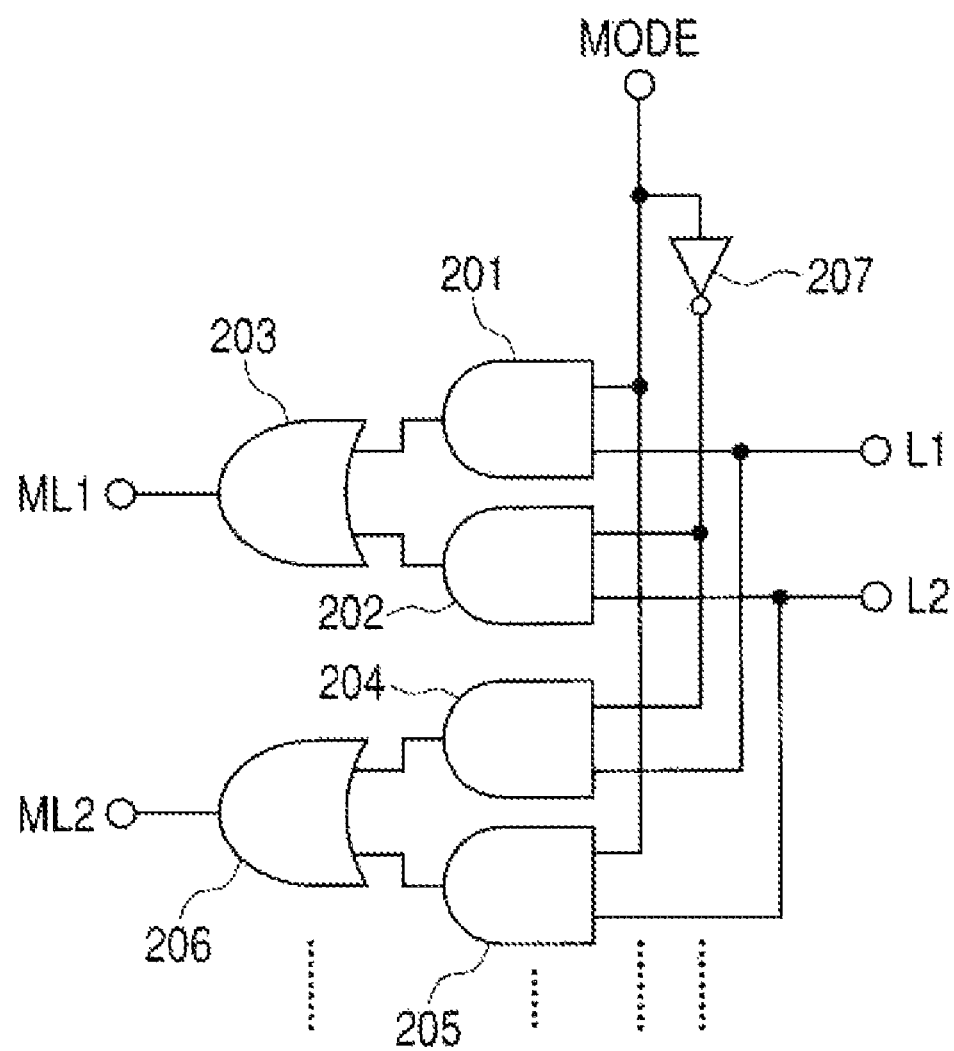
FIG. 2 is a diagram illustrating an example configuration of a line selection switching circuit according to the first embodiment.

FIG. 2 is a diagram illustrating an example configuration of the line selection switching circuit 108.

The line selection switching circuit 108 is a circuit that switches line selection pulses (line selection signals) to be input to the sensor drive circuit 105 according to the designated mode, and includes, for example, AND circuits and OR circuits.

In the example illustrated in FIG. 2, a mode signal MODE is input to an AND circuit 201, and a line selection pulse L1 is also input to the AND circuit 201. The mode signal MODE is input via an inverter 207 to an AND circuit 202, and a line selection pulse L2 is also input to the AND circuit 202. An output of the AND circuit 201 and an output of the AND circuit 202 are input to an OR circuit 203, and the arithmetic operation result is output from the OR circuit 203 as a line selection pulse ML1 according to the designated mode.

The mode signal MODE is input via the inverter 207 to an AND circuit 204, and the line selection pulse L1 is also input to the AND circuit 204. The mode signal MODE is input to an AND circuit 205, and the line selection pulse L2 is also input to the AND circuit 205. An output of the AND circuit 204 and an output of the AND circuit 205 are input to an OR circuit 206, and the arithmetic operation result is output from the OR circuit 206 as a line selection pulse ML2 according to the designated mode.

In other words, when the mode signal MODE=1 (high), the line selection switching circuit 108 outputs the line selection pulse ML1 to the sensor drive circuit 105 in response to the line selection pulse L1 input from the line selecting circuit 106. Meanwhile, when the mode signal MODE=0 (low), the line selection switching circuit 108 outputs the line selection pulse ML2 to the sensor drive circuit 105 in response to the line selection pulse L1 input from the line selecting circuit 106.

In the same way, when the mode signal MODE=1, the line selection switching circuit 108 outputs the line selection pulse ML2 to the sensor drive circuit 105 in response to the line selection pulse L2 input from the line selecting circuit 106. Meanwhile, when the mode signal MODE=0, the line selection switching circuit 108 outputs the line selection pulse ML1 to the sensor drive circuit 105 in response to the line selection pulse L2 input from the line selecting circuit 106.

This line selection switching circuit 108 enables swapping of ranging point region arrays in two line sensor groups between the first mode and the second mode.

Next, description will be given on operation.

Figure 3:
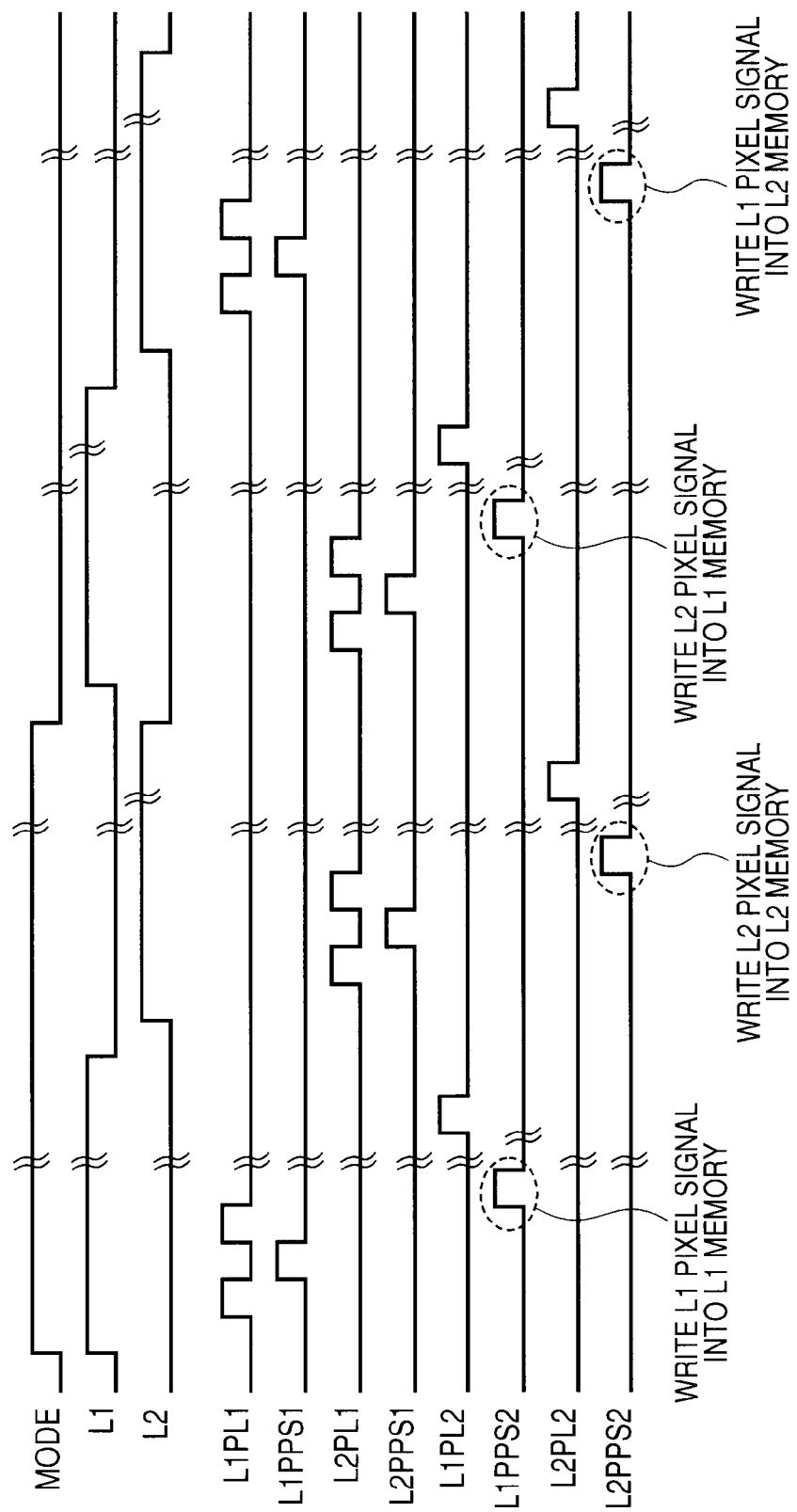
FIG. 3 is a diagram illustrating an example of drive pulses for an area-type AF sensor according to the first embodiment.

FIG. 3 is a diagram illustrating an example of drive pulses according to the area-type AF sensor according to the present embodiment. In FIG. 3, MODE represents a mode signal for switching between the first mode and the second mode, and L1 and L2 represent line selection pulses.

When the mode signal MODE=1, the area-type AF sensor operates in the first mode. In the first mode, as illustrated in FIG. 1A, regions 1, 3 and 5 are selected along the first array as ranging point regions in the first line sensor L1 group 101, and regions 1, 2, 4 and 5 are selected along the second array as ranging point regions in the second line sensor L2 group 102. The sensor elements in each ranging point region output signals stored in the respective photo diodes, as effective portions. The sensor elements, which are effective portions, are subject to arithmetic operations for automatic detecting focus, as AGC regions. After the AGC operation, the signals are transferred to, written and retained in frame memories. The signal retained in the frame memories are processed as signals for pixels for arithmetic operations.

In other words, signals from the sensor elements in the ranging point regions (the sensor elements which are effective portions) in the first line sensor L1 group 101 are read out in response to a sensor read pulse L1PL1. Subsequently, the signals read out from the first line sensor L1 group 101 are written and retained in frame memories arranged corresponding one by one to the sensor elements in response to a write pulse L1PPS2 for the memories in the first line memory L1 group 103.

In the same way, signals from the sensor elements in the ranging point regions (the sensor elements which are effective portions) in the second line sensor L2 group 102 are read out in response to a sensor read pulse L2PL1. Subsequently, the signals read out from the second line sensor L2 group 102 are written and retained in frame memories arranged corresponding one by one to the sensor elements in response to a write pulse L2PPS2 for the memories in the second line memory L2 group 104.

When the mode signal MODE=0, the area-type AF sensor operates in the second mode. In the second mode, as illustrated in FIG. 1B, the regions 1, 2, 4 and 5 are selected along the second array as ranging point regions in the first line sensor L1 group 101, and the regions 1, 3 and 5 are selected along the first array as ranging point regions in the second line sensor L2 group 102. In other words, the line selection switching circuit 108 swaps the array of ranging point regions in the first line sensor L1 group 101 and the array of ranging point regions in the second line sensor L2 group 102 with each other relative to the first mode. Accordingly, the regions in which the ranging point regions in the first line sensor L1 group 101 and the ranging point regions in the second line sensor L2 group 102 partially overlap in the row direction are used as sensor elements that are effective portions in both the first mode and the second mode.

Sensor elements in each ranging point region output signals stored in their respective photo diodes, as effective portions. The sensor elements that are effective portions are subject to arithmetic operations for automatic detecting focus as AGC regions. After the AGC operation, the signals are transferred to, written and retained in frame memories. The signals retained in the frame memories are processed as signals of pixels for arithmetic operations.

In other words, signals from the sensor elements in the ranging point regions (the sensor elements which are effective portions) in the second line sensor L2 group 102 are read out in response to the sensor read pulse L2PL1. Subsequently, the signals read out from the second line sensor L2 group 102 are written and retained in frame memories in response to the write pulse L1PPS2 for the memories in the first line memory L1 group 103.

In the same way, signals from the sensor elements in the ranging point regions (the sensor elements which are effective portions) in the first line sensor L1 group 101 are read out in response to the sensor read pulse L1PL1. Subsequently, the signals read out from the first line sensor L1 group 101 are written and retained in frame memories in response to the write pulse L2PPS2 for the memories in the second line memory L2 group 104.

In other words, the operation is characterized in that while signals from the line sensor L1 group are written in the line memory L1 group in the first mode, signals from the line sensor L2 group are written in the line memory L1 group in the second mode. In the same way, the operation is characterized in that while signals from the line sensor L2 group are written in the line memory L2 group in the first mode, signals from the line sensor L1 group are written in the line memory L2 group in the second mode. In other words, the operation is characterized in that the frame memories driven in the first mode and those driven in the second mode are the same.

When signals retained in the first line memory L1 group 103 or the second line memory L2 group 104 are read out, the signals are sequentially read out from the frame memories via inversion amplifiers (not illustrated) by means of a shift register.

With the above-described drive method, swapped signals can be written without the trouble of providing decoder information to the memory drive circuits.

According to the above, the first mode and the second mode are combined, the first AF sequence is performed in the first mode, and then the second AF sequence is performed in the second mode, enabling an increase in ranging points in chronological order. Also, determination of whether a ranging point manually selected by a shooter is a ranging point in the first mode or a ranging point in the second mode enables selection of an optimum ranging point.

According to the present embodiment, different ranging point regions can be selected even for one and the same line sensor, enabling an increase in the number of ranging points. Also, the frame memories are shared to suppress the size of the line selection switching circuit 108 that selects ranging point regions, enabling provision of a low-cost auto-focus sensor with a chip-area increase suppressed and an increased number of ranging points.

Second Embodiment

Figure 4:
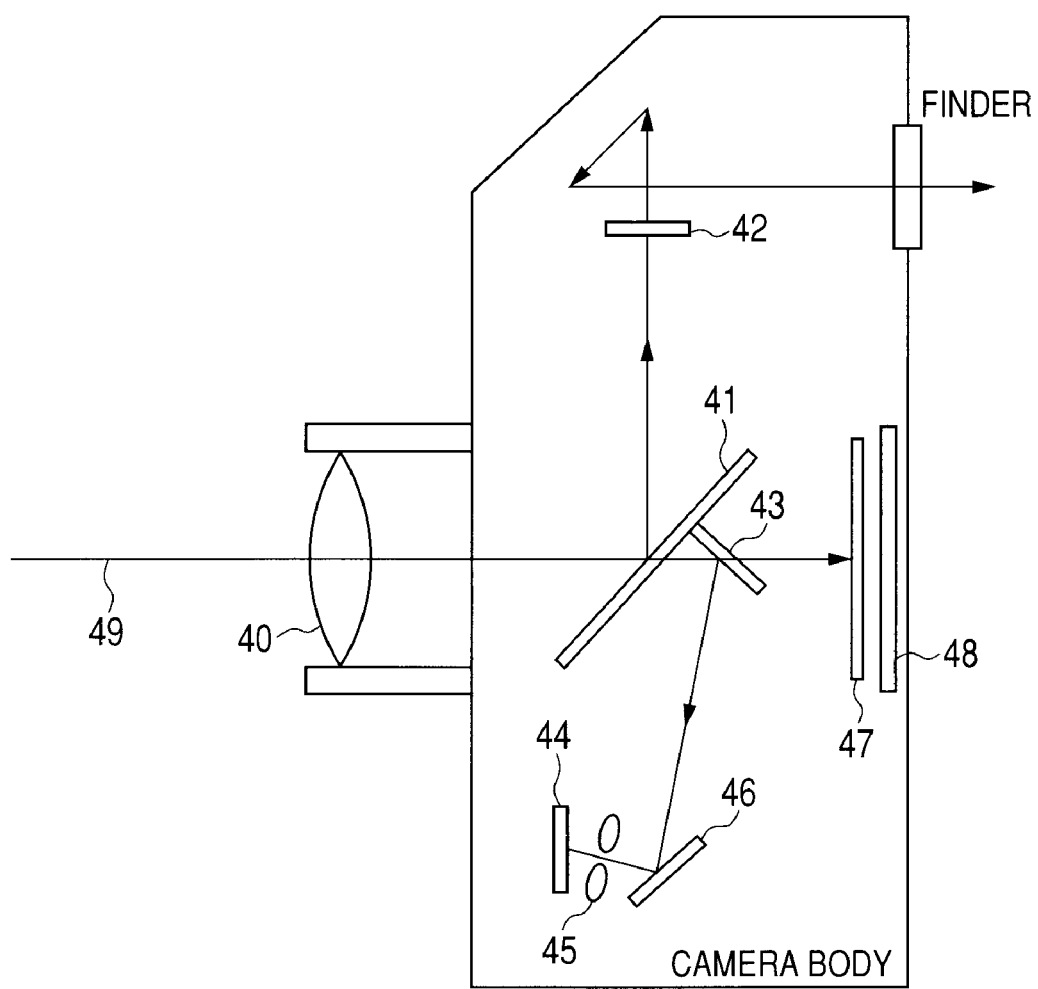
FIG. 4 is a representative diagram illustrating a second embodiment of the present invention.

FIG. 4 is a schematic diagram of an optical system of a single-lens reflex camera equipped with a TTL-SIR (Through-The-Lens Secondary Image Registration) auto-focus system, which employs a photoelectric conversion apparatus for detecting focus according to an embodiment of the present invention. The camera illustrated in FIG. 4 includes a taking lens 40 for temporarily forming an image of a subject on a film or an image sensor, and a quick-return mirror 41 for reflecting light on a finder screen 42, which is a half mirror that transmits several tens of percent of light. The camera also includes a sub-mirror 43 for guiding light to the AF system, a photoelectric conversion apparatus for detecting focus 44, a secondary imaging lens (glass lens) 45 for re-forming an image of a subject on the AF sensor, a reflecting mirror 46 that guides light to the AF sensor 44, a focal plane shutter 47, and a film or image sensor 48. An optical axis 49 is also indicated in the Figure.

In the present embodiment, use of a photoelectric conversion apparatus for detecting focus according to the first embodiment enables provision of a low-cost single-lens reflex camera with an increased number of ranging points compared to the conventional ones.

In the present embodiment, it is clear that the present invention can be applied to any TTL-SIR AF cameras regardless of analog or digital ones.

Both of the above-described embodiments are mere examples of embodiments for carrying out the present invention, and the technical scope of the present invention should not be limitedly interpreted by these embodiments. In other words, the present invention can be carried out in various modes as long as such modes do not deviate from the technical area or main features of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-046608, filed Feb. 27, 2009, which is hereby incorporated by reference herein in its entirety.

What is claimed is:

1. A photoelectric conversion apparatus comprising:
   a plurality of line sensors, each arranged along a respective one of a plurality of rows,
   wherein the line sensors each include a plurality of sensor elements, and each of the line sensors is controlled such that:
      in a first mode, first sensor elements within the line sensor, arranged correspondingly to a ranging point region for detecting focus in the first mode, are set as effective, while the other sensor elements within the line sensor, arranged outside of the region corresponding to the ranging point region for detecting focus in the first mode, are set as non-effective, and in a second mode, the other sensor elements within the line sensor are set as effective, while at least some of the first sensor elements are set as non-effective, and wherein a portion of the sensor elements within each of the line sensors are set as effective in both of the first and second modes.

2. The photoelectric conversion apparatus according to claim 1, further comprising a sensor drive circuit, a frame memory, a line selecting circuit, and a line selection switching circuit, wherein a signal from an effective portion of a group of the line sensors selected by the line selecting circuit is transferred by the sensor drive circuit to the frame memory corresponding to the effective portion, and held by the frame memory so as to be processed as a signal for arithmetic operation, wherein a switching of the ranging point region between the first and second modes is controlled through the line selection switching circuit connected between the sensor drive circuit and the line selecting circuit, and wherein the frame memory for driving in the first mode and the frame memory for driving in the second mode are the same.

3. A photoelectric conversion apparatus comprising:

a plurality of line sensors including first and second line sensors;

a first line memory having memories, each one arranged correspondingly to a respective one of sensor elements in a ranging point region in a respective first array of each of the first and second line sensors;

a second line memory having memories, each one arranged correspondingly to a respective one of sensor elements in a ranging point region in a respective second array of each of the first and second line sensors; and a control circuit, wherein the control circuit controls in a first mode such that signals read out from the sensor elements in the ranging point region in the first array of the first line sensor are written in the first line memory, and signals read out from the sensor elements in the ranging point region in the second array of the second line sensor are written in the second line memory, and wherein the control circuit controls in a second mode such that signals read out from the sensor elements in the ranging point region in the second array of the first line sensor are written in the second line memory, and signals read out from the sensor elements in the ranging point region in the first array of the second line sensor are written in the first line memory, and wherein the ranging point region in the first array of each of the first and second line sensors is different from the ranging point region in the second array of the respective line sensor.

4. The photoelectric conversion apparatus according to claim 3, wherein the ranging point region in the first array of at least one of the first and second line sensors is overlapped at least in part with the ranging point region in the second array of the respective line sensor.

5. The photoelectric conversion apparatus according to claim 3, wherein the control circuit conducts the controlling such that, after an operation of the first mode, an operation of the second mode is conducted.

6. An imaging system comprising the photoelectric conversion apparatus according to claim 3, as an AF sensor.

7. A driving method of a photoelectric conversion apparatus which includes first and second line sensors, each having a plurality of pixels, and a line memory, the method comprising:

in a first mode, reading out signals from a first set of the pixels of the first line sensor without reading out signals from pixels of the first line sensor other than the first set of the pixels, and reading out signals from a second set of the pixels of the second line sensor without reading out signals from pixels of the second line sensor other than the second set of the pixels; and in a second mode, reading out signals from a third set of the pixels of the first line sensor without reading out signals from pixels of the first line sensor other than the third set of the pixels, and reading out signals from a fourth set of the pixels of the second line sensor without reading out signals from pixels of the second line sensor other than the fourth set of the pixels, wherein the first and third sets of the pixels include different pixels, and the second and fourth sets of the pixels include different pixels.

8. The driving method according to claim 7, wherein the first and second sets of pixels are arranged in a staggered manner.

* * * * *